United States Patent
Xi et al.

(10) Patent No.: US 12,513,894 B2
(45) Date of Patent: Dec. 30, 2025

(54) SEMICONDUCTOR STRUCTURE, METHOD FOR MANUFACTURING SEMICONDUCTOR STRUCTURE, AND MEMORY

(71) Applicant: CHANGXIN MEMORY TECHNOLOGIES, INC., Hefei (CN)

(72) Inventors: Ning Xi, Hefei (CN); Jingwen Lu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 636 days.

(21) Appl. No.: 17/951,518

(22) Filed: Sep. 22, 2022

(65) Prior Publication Data
US 2023/0015580 A1   Jan. 19, 2023

Related U.S. Application Data

(63) Continuation of application No. PCT/CN2022/097307, filed on Jun. 7, 2022.

(30) Foreign Application Priority Data

May 23, 2022   (CN) .......................... 202210563800.9

(51) Int. Cl.
*H10B 12/00*   (2023.01)
(52) U.S. Cl.
CPC ............ *H10B 12/34* (2023.02); *H10B 12/053* (2023.02)
(58) Field of Classification Search
CPC ..... H10B 12/053; H10B 12/34; H10B 12/488
See application file for complete search history.

(56) References Cited

U.S. PATENT DOCUMENTS

| | | | |
|---|---|---|---|
| 2008/0311735 A1 | 12/2008 | Lee | |
| 2011/0306170 A1* | 12/2011 | Wang | H01L 21/32155 257/E21.409 |
| 2015/0214313 A1* | 7/2015 | Oh | H10D 30/62 438/270 |
| 2016/0149008 A1* | 5/2016 | Kim | H10B 41/30 257/295 |
| 2022/0093592 A1 | 3/2022 | Guler et al. | |
| 2023/0009397 A1* | 1/2023 | Tsai | H10B 12/34 |

FOREIGN PATENT DOCUMENTS

| | | |
|---|---|---|
| CN | 101325173 A | 12/2008 |
| CN | 104810390 B | 7/2019 |
| CN | 112447717 A | 3/2021 |
| CN | 114093941 A | 2/2022 |

\* cited by examiner

*Primary Examiner* — Nelson Garces
(74) *Attorney, Agent, or Firm* — Syncoda LLC; Feng Ma (57) ABSTRACT

A semiconductor structure, a method for manufacturing a semiconductor structure, and a memory are provided. The semiconductor structure includes: a source and a drain which are arranged in a substrate; a gate dielectric layer arranged in the substrate and covering a sidewall and a bottom portion of a trench defined between the source and the drain; a gate structure arranged in the trench, in which a material of the gate structure includes metal or metal compound; and a gate adjustment layer at least arranged between the gate dielectric layer and the gate structure. A sidewall of the gate structure is provided with a first control area covered with the gate adjustment layer, and a bottom surface of the gate structure is provided with a second control area not covered with the gate adjustment layer. A material of the gate adjustment layer includes polycrystalline silicon.

18 Claims, 10 Drawing Sheets

SEMICONDUCTOR STRUCTURE, METHOD FOR MANUFACTURING SEMICONDUCTOR STRUCTURE, AND MEMORY

CROSS-REFERENCE TO RELATED APPLICATIONS

This is a continuation application of International Patent Application No. PCT/CN20221097307, filed on Jun. 7, 2022, which claims priority to Chinese Patent Application No. 202210563800.9, filed on May 23, 2022 and entitled "SEMICONDUCTOR STRUCTURE, METHOD FOR MANUFACTURING SEMICONDUCTOR STRUCTURE, AND MEMORY". The disclosures of these applications are incorporated by reference herein in their entirety.

BACKGROUND

A transistor in a semiconductor structure is widely used as a switching device or a driving device in electronic equipment. For example the transistor may be used in a Dynamic Random Access Memory (DRAM) to control a capacitor in each memory cell. The basic structure of the memory cell of the DRAM consists of one transistor and one storage capacitor, and its main principle is to use the amount of charges stored in the capacitor to represent whether a binary bit is 1 or 0.

However, the transistor in the related art still has many problems that need to be improved.

SUMMARY

The present disclosure relates to the technical field of semiconductors, in particular to a semiconductor structure, a method for manufacturing a semiconductor structure, and a memory.

Embodiments of the present disclosure provide a semiconductor structure, a method for manufacturing a semiconductor structure, and a memory.

According to a first aspect of the embodiments of the present disclosure, a semiconductor structure is provided which includes:
   a source and a drain which are arranged in a substrate;
   a gate dielectric layer arranged in the substrate and covering a sidewall and a bottom portion of a trench defined between the source and the drain;
   a gate structure arranged in the trench, in which a material of the gate structure includes metal or metal compound; and
   a gate adjustment layer at least arranged between the gate dielectric layer and the gate structure.

A sidewall of the gate structure is provided with a first control area covered with the gate adjustment layer, and a bottom surface of the gate structure is provided with a second control area not covered with the gate adjustment layer. A material of the gate adjustment layer includes polycrystalline silicon.

According to a second aspect of the embodiments of the present disclosure, a memory is provided, which includes:
   a semiconductor structure;
   a memory cell coupled with one of the source and the drain; and
   a bit line coupled with the other one of the source and the drain.

The semiconductor structure includes: a source and a drain which are arranged in a substrate; a gate dielectric layer arranged in the substrate and covering a sidewall and a bottom portion of a trench defined between the source and the drain; a gate structure arranged in the trench, in which a material of the gate structure includes metal or metal compound; and a gate adjustment layer at least arranged between the gate dielectric layer and the gate structure.

A sidewall of the gate structure is provided with a first control area covered with the gate adjustment layer, and a bottom surface of the gate structure is provided with a second control area not covered with the gate adjustment layer. A material of the gate adjustment layer includes polycrystalline silicon.

According to a third aspect of the embodiments of the present disclosure, a method for manufacturing a semiconductor structure is provided, which includes the following operations.

A substrate is provided, in which the substrate includes a source, a drain, a trench arranged between the source and the drain, and a gate dielectric layer covering a sidewall and a bottom portion of the trench.

A gate adjustment layer at least partially covering the gate dielectric layer is formed, in which a material of the gate adjustment layer includes polycrystalline silicon.

A gate structure is formed in the trench in which the gate adjustment layer is formed, in which a material of the gate structure includes metal or metal compound.

A sidewall of the gate structure is provided with a first control area covered with the gate adjustment layer, and a bottom surface of the gate structure is provided with a second control area not covered with the gate adjustment layer.

BRIEF DESCRIPTION OF THE DRAWINGS

FIG. 5A to FIG. 5I are schematic diagrams of processes of a method for manufacturing a semiconductor structure according to an embodiment of the present disclosure; and FIG. 6A to FIG. 6L are schematic diagrams of processes of a method for manufacturing another semiconductor structure according to an embodiment of the present disclosure.

DETAILED DESCRIPTION

In order to make the technical solutions and advantages of the embodiments of the present disclosure clearer, the technical solutions of the present disclosure will be further described in details below with reference to the accompanying drawings and the embodiments. Although the exemplary implementations of the disclosure are shown in the accompanying drawings, it should be understood that the present disclosure may be implemented in various forms and cannot be limited by the implementations illustrated herein. On the contrary, the implementations are provided to more thoroughly understand the present disclosure and to completely convey the scope of the present disclosure to those skilled in the art.

The present disclosure is described more specifically by way of example in the following paragraphs with reference to the accompanying drawings. The advantages and features of the present disclosure will become apparent in light of the following descriptions and claims. It should be noted that the accompanying drawings are provided in a very simplified form not necessary drawn to exact scale, and are only intended to facilitate convenience and clarify in explaining the embodiments of the present disclosure.

It may be understood that the meanings of "on . . . " "over" and "above" in the present disclosure should be read in the broadest manner, so that "on . . . " not only means that it is "on" something without any intervening features or layers therebetween (i.e., directly on something), but also includes the meaning of being "on" something with intervening features or layers therebetween.

In addition, for the convenience of description, spatial relative terms such as "on", "above", "over", "top" and "upper" may be used herein to describe a relationship of one element or feature and another element or feature as shown in the figures. In addition to the orientations shown in the figures, the spatial relative terms are intended to include different orientations of the devices in use or operation. The device may be otherwise oriented (rotated by 90 degrees or in other orientations) and the spatial relative descriptors used herein may also be explained accordingly.

In the embodiments of the present disclosure, the term "substrate" refers to a material on which subsequent material layers are added. The substrate itself may be patterned. The material added on the top portion of the substrate may be patterned or may remain unpatterned. In addition, the substrate may include various semiconductor materials, such as silicon, silicon germanium, germanium, arsenide, indium phosphide, etc. Alternatively, the substrate may be made of a non-conductive material, such as glass, plastic or sapphire wafers.

In the embodiments of the present disclosure, the term "layer" refers to a portion of material that includes an area having a thickness. The layer may extend over the entirety of the structure below or above the layer, or may have an extent smaller than the extent of the structure below or above the layer. Moreover, the layer may be an area of homogeneous or inhomogeneous continuous structure having a thickness less than the thickness of the continuous structure. For example, the layer may be located between the top surface and the bottom surface of the continuous structure, or the layer may be arranged between any pairs of the horizontal faces at the top surface and bottom surface of the continuous structure. The layer may extend horizontally, vertically, and/or along an inclined surface. The layer may include a plurality of sub-layers. For example, the interconnection layer may include one or more conductor and contact sub-layers (in which interconnection wires and/or through-hole contacts are formed), and one or more dielectric sub-layers.

In the embodiments of the present disclosure, the terms "first", "second" and the like are intended to distinguish similar objects but do not necessarily indicate a specific sequence or order.

The semiconductor stricture involved in the embodiments of the present disclosure is at least a part that will be used in the subsequent process to form the final device structure. Herein, the final device may include a memory. The memory includes, but is not limited to, a DRAM. The DRAM is only taken as an example for description below.

With the development of the DRAM technology, the dimension of the memory cell becomes smaller and smaller, and its array architecture changes from $8F^2$ to $6F^2$ to $4F^2$. In addition, based on the requirements for ions and leakage current in the DRAM, the architecture of the memory changes from Planar Array Transistor to Recess Gate Array Transistor, from the Recess Gate Array Transistor to Buried Channel Array Transistor, and then from the Buried Channel Array Transistor to Vertical Channel Array Transistor.

In practical applications, regardless of whether the architecture of the memory is the Planar Array Transistor, the Recess Gate Array Transistor, the Buried Channel Array Transistor, or the Vertical Channel Array Transistor, the DRAM is composed of multiple memory cells. The structure of each memory cell is mainly composed of one transistor and one memory cell (storage capacitor) controlled by the transistor. That is, the DRAM includes the architecture of one Transistor (T) and one Capacitor (C) (1T1C), and its main principle is to use the amount of charges stored in the capacitor to represent whether a binary bit is 1 or 0.

Figure 1:
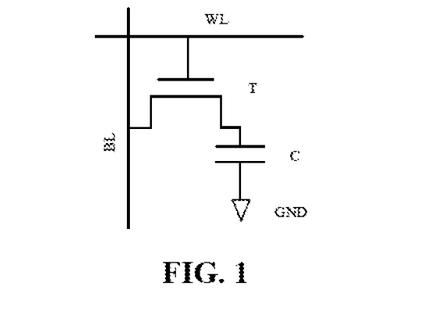
FIG. 1 is a schematic diagram of circuit connection of a semiconductor structure according to an embodiment of the present disclosure.

FIG. 1 is a schematic diagram of circuit connection using the 1T1C architecture according to an embodiment of the present disclosure. As shown in FIG. 1, the drain of the transistor T is electrically connected to a Bit Line (BL), the source of the transistor T is electrically connected to one electrode plate of the capacitor C, another electrode plate of the capacitor C may be connected to a reference voltage which may be a ground voltage or other voltages, and the gate of the transistor T is connected to a Word Line (WL). The voltage is applied through the word line WL to control the transistor T to be turned on or turned off. The bit line BL is configured to perform a read or write operation on the transistor T when the transistor T is turned on.

Figure 2:
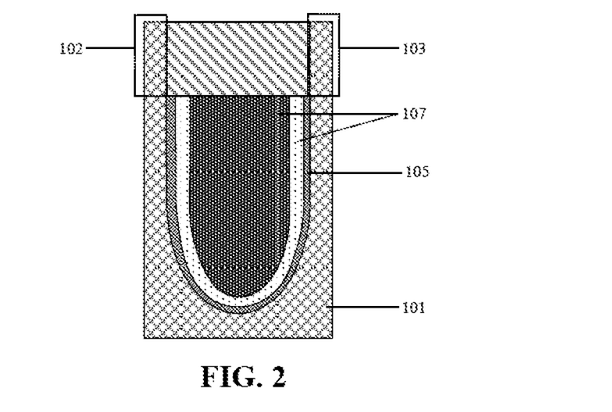
FIG. 2 is a schematic diagram of a semiconductor structure according to an embodiment of the present disclosure.

FIG. 2 is a schematic diagram of a semiconductor structure according to an embodiment of the present disclosure. An embodiment of the present disclosure provides a semiconductor structure. As shown in FIG. 2, the semiconductor structure includes:
 a source 102 and a drain 103 which are arranged in a substrate 101;
 a gate dielectric layer 105 arranged in the substrate 101 and covering a sidewall and a bottom portion of a trench defined between the source 102 and the drain 103;
 a gate structure 107 arranged in the trench, a material of the gate structure 107 including metal or metal compound.

It is found through research that when the above-mentioned transistor structure is adopted, the gate structure 107 containing metal tungsten and metal compound titanium nitride has lower resistance, which may reduce the word line resistance. However, with the development of the semiconductor technology, the dimension of the memory becomes smaller and smaller, and the gate-induced drain leakage has a huge adverse effect on the formation of the buried array transistor, which reduces the performance of the semiconductor structure.

Based on one or more of the above-mentioned problems, the embodiments of the present disclosure provide a semiconductor structure, a method for manufacturing a semiconductor structure, and a memory.

Figure 3A:
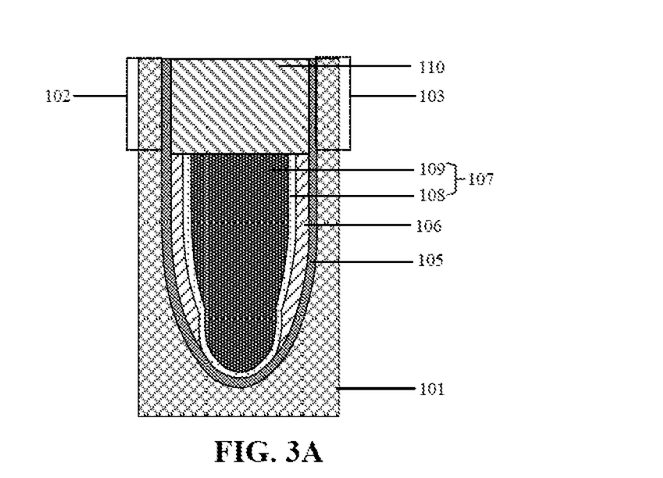
FIG. 3A is a first schematic diagram of another semiconductor structure according to an embodiment of the present disclosure.

FIG. 3A is a first schematic diagram of a semiconductor structure according to an embodiment of the present disclosure. As shown in FIG. 3A, the semiconductor structure includes:

a source 102 and a drain 103 which are arranged in a substrate 101;

a gate dielectric layer 105 arranged in the substrate 101 and covering a sidewall and a bottom portion of a trench defined between the source 102 and the drain 103;

a gate structure 107 arranged in the trench, a material of the gate structure 107 including metal or metal compound; and a gate adjustment layer 106 at least arranged between the gate dielectric layer 105 and the gate structure 107.

A sidewall of the gate structure 107 is provided with a fast control area covered with the gate adjustment layer 106, and a bottom surface of the gate structure 107 is provided with a second control area not covered with the gate adjustment layer 106. A material of the gate adjustment layer 106 includes polycrystalline silicon.

Here, in practical applications, the semiconductor structure may include a transistor.

In some specific examples, the substrate 101 may include an elemental semiconductor material substrate (for example, a silicon (Si) substrate, a germanium (Ge) substrate, etc.), a compound semiconductor material substrate (for example a silicon germanium (SiGe) substrate, etc.), a Silicon On Insulator (SOI) substrate, a Germanium On Insulator (GeOI) substrate, etc. Preferably, the substrate is a silicon substrate.

Here, the substrate 101 between the source 102 and the drain 103 forms a channel area. The channel area provided in the embodiments of the present disclosure may be a U-shaped channel area.

Here, the gate dielectric layer 105 may also be referred to as a gate oxide layer configured to electrically isolate the channel area from the gate structure 107. Here, the material of the gate dielectric layer 105 may include, but is not limited to, silicon oxide.

Specifically, the gate dielectric layer 105 may be configured to induce different electric fields and apply them on the surface of the channel area, so that minority carriers in the semiconductor structure are adsorbed to the surface of the channel area to be accumulated and inverted, thereby realizing the conduction between the source 102 and the drain 103.

Here, the first control area refers to the portion of the sidewall of the gate stricture 107 covered with the gate adjustment layer 106, and the second control area refers to the portion of the bottom surface of the gate structure 107 not covered with the gate adjustment layer 106.

It can be understood that the sidewall of the gate structure 107 is provided with a first control area covered with the gate adjustment layer 106. That is, a portion of the gate structure 107 is replaced with the gate adjustment layer 106. In the area of the gate structure 107 in which the problem of gate-induced drain leakage is likely to occur, the gate structure 107 is surrounded by the gate adjustment layer 106 made of the polycrystalline silicon, and the leakage of the polycrystalline silicon near the drain 103 is smaller than that of the metal or metal compound, so that the problem of gate-induced drain leakage may be effectively improved. However, the resistance of the polycrystalline silicon is higher than that of the metal and the metal compound. If the sidewall and the bottom surface of the gate structure 107 are all covered with the gate adjustment layer 106, the resistance may be too large, so that the current is reduced. In order to balance the current and the gate-induced drain leakage, in the embodiment of the present disclosure, a second control area is further provided based on the first control area, so that the problem of gate-induced drain leakage may be effectively improved, and the current may be maintained within a suitable range.

In some embodiments, an area of the first control area accounts for 60%-100% of an area of the sidewall of the gate structure 107.

Figure 3B:
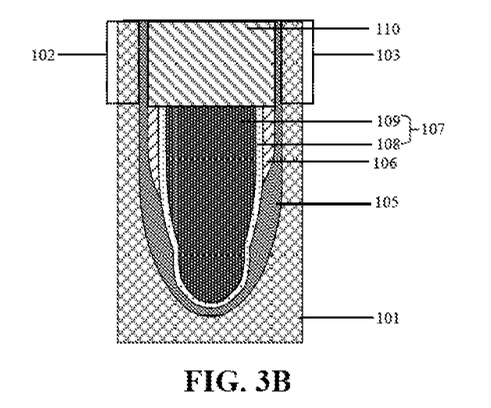
FIG. 3B is a second schematic diagram of another semiconductor structure according to an embodiment of the present disclosure.

FIG. 3B is a second schematic diagram of a semiconductor structure according to an embodiment of the present disclosure.

Here, the area of the first control area accounts for 60%-100% of the area of the sidewall of the gate structure 107. It can be understood that the sidewall of the gate structure 107 may be completely covered with the gate adjustment layer 106, or may be partially covered with the gate adjustment layer 106. When the area of the first control area accounts for 100% of the area of the sidewall of the gate structure 107, it means that the sidewall of the gate structure 107 is completely covered with the gate adjustment layer 106. As shown in FIG. 3A, the sidewall of the gate structure 107 is completely covered with the gate adjustment layer 106. As shown in FIG. 3B, the sidewall of the gate structure 107 is partially covered with the gate adjustment layer 106. When the sidewall of the gate structure 107 is completely covered with the gate adjustment layer 106, the improvement effect on the problem of gate-induced drain leakage is better. The less the sidewall of the gate structure 107 is covered with the gate adjustment layer 106, the worse the improvement effect on the problem of gate-induced drain leakage is, but the lower the resistance is. In practical applications, the choice may be made based on the requirements for the gate-induced drain leakage and the resistance.

It should be emphasized that the first control area is arranged around the gate structure 107. It can be understood that the figures in the embodiments of the present disclosure only show cross-sectional views of the semiconductor structure, but the gate structure 107 is actually columnar. When the first control area does not completely cover the sidewall of the gate structure 107, if the first control area is not arranged around the gate structure 107, an opening is formed, which leads to the problem of gate-induced drain leakage occurring from the opening.

In some embodiments, a top edge of the first control area is not lower than a top edge of the sidewall of the gate structure 107.

It can be understood that the problem of gate-induced drain leakage is more likely to occur in the area where the gate structure 107 is closer to the drain 103, that is, the problem of gate-induced drain leakage is more likely to occur at the position close to the top portion of the gate structure 107. In the embodiment of the present disclosure, the area of the gate structure 107, where the gate-induced drain leakage is likely to occur, is surrounded by the gate adjustment layer 106, so that the problem of gate-induced drain leakage may be effectively improved. If the top edge of the first control area is lower than the top edge of the sidewall of the gate structure 107, it means that the topmost sidewall of the gate structure 107 is not covered with the gate adjustment layer 106. However, the problem of gate-induced drain leakage is the most likely to occur at the top sidewall of the gate structure 107. Therefore, in the embodiment of the present disclosure, the top edge of the first control area is set to be equal to or higher than the top edge of the sidewall of the gate structure 107, so as to effectively improve the problem of gate-induced drain leakage.

Figure 3C:
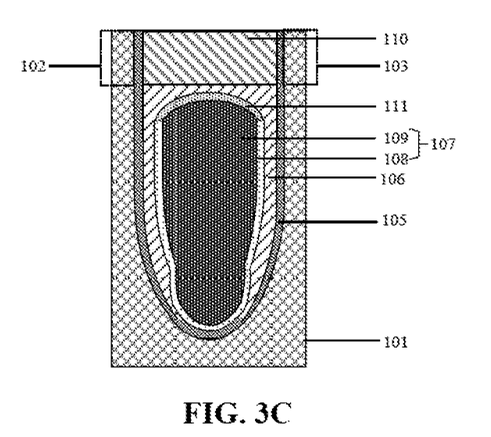
FIG. 3C is a third schematic diagram of another semiconductor structure according to an embodiment of the present disclosure.
Figure 3D:
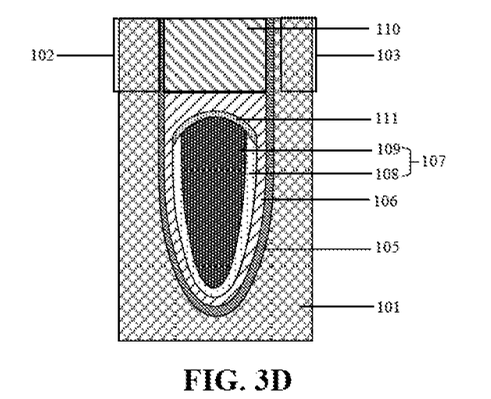
FIG. 3D is a fourth schematic diagram of another semiconductor stricture according to an embodiment of the present disclosure.

FIG. 3C is a third schematic diagram of a semiconductor structure according to an embodiment of the present disclosure. FIG. 3D is a fourth schematic diagram of a semiconductor structure according to an embodiment of the present disclosure.

For the specific area covered with the gate adjustment layer 106, the embodiments of the present disclosure propose the following different solutions. The following solutions are only exemplary, and are not intended to limit the area covered with the gate adjustment layer 106 in the present disclosure.

In some embodiments, as shown in FIG. 3B, the gate adjustment layer 106 at least covers a portion of the sidewall of the gate structure 107 and does not cover the bottom surface of the gate structure 107.

It can be understood that the bottom surface of the gate structure 107 is not covered with the gate adjustment layer 106, which may effectively increase the current and avoid excessive resistance.

In some embodiments, as shown in FIG. 3C, the gate adjustment layer 106 covers the sidewall of the gate structure 107, and covers the top surface and a portion of the bottom surface of the gate structure 107.

Here, the gate adjustment layer 106 covers the sidewall, the top surface and a portion of the bottom surface of the gate structure 107, so that the problem of gate-induced drain leakage may be further improved. It can be understood that the gate adjustment layer 106 surrounds the top portion of the gate structure 107 as a whole, so that the current is less likely to leak out from the gate structure 107. However, a portion of the bottom surface of the gate structure 107 is still not covered with the gate adjustment layer 106, since the resistance of the gate adjustment layer 106 is larger than that of the gate structure 107. If the gate adjustment layer 106 covers the entire bottom portion of the gate structure 107, the resistance may be too large, and the current becomes smaller. Therefore, here, the gate adjustment layer 106 only covers a portion of the bottom surface of the gate structure 107.

In some embodiments, as shown in FIG. 3C and FIG. 3D, a contact interface between the gate adjustment layer 106 and the top surface of the gate structure 107 is a curved surface.

It can be understood that the contact interface between the gate adjustment layer 106 and the top surface of the gate structure 107 is set to be a curved surface. Compared with a flat surface, the contact area between the gate structure with a curved top portion and the gate adjustment layer is larger, so that the problem of gate-induced drain leakage may further be improved.

In some embodiments, as shown in FIG. 3A, FIG. 3B and FIG. 3C, the gate structure 107 is provided with a protrusion in the second control area.

It can be understood that the portion of the bottom portion of the gate structure 107, which is not covered with the gate adjustment layer 106, is provided with a protrusion structure. The protrusion structure is formed by removing the gate adjustment layer 106 under the gate structure 107 and then filling the material of the gate structure 107. The protrusion structure here increases the cross-sectional area of the gate, thereby reducing the resistance of the current passing through the word line when passing through the gate. It can be understood that when the resistance of the gate is reduced, the load on the word line is reduced, and the number of transistors that can be controlled by the word line may also be increased, or the turn-on voltage of the word line may be reduced to reduce the power consumption of the word line. Therefore, the protrusion structure here may increase the current of the word line, so as to achieve a better control effect on the transistor.

In some embodiments, the gate adjustment layer 106 is doped with impurities, and a doping type of the gate adjustment layer 106 is different from a doping type of each of the source 102 and the drain 103.

In some specific examples, when the doping type of each of the source 102 and the drain 103 is N type, the doping type of the gate adjustment layer 106 is P type. When the doping type of each of the source 102 and the drain 103 is P type, the doping type of the gate adjustment layer 106 is N type.

In some embodiments, a doping concentration of the impurities doped in the gate adjustment layer 106 ranges from $10^{19}$ ions/cm$^3$ to $10^{20}$ ions/cm$^3$.

It can be understood that the resistance of the gate adjustment layer 106 may be reduced by performing doping treatment on the gate adjustment layer 106, and the resistance may be smaller by setting the doping concentration as large as possible, thereby increasing the current of the word line.

It should be noted that the above-mentioned range of the doping concentration of the doping impurities in the gate adjustment layer 106 is only an exemplary illustration, and is not intended to limit the doping concentration of the doping impurities in the gate adjustment layer 106 in the embodiment of the present disclosure.

In some embodiments, the material of the gate structure 107 includes tungsten and/or titanium nitride.

In some embodiments, as shown in FIG. 3A to FIG. 3D, the gate structure 107 includes a gate, and a first bather layer 108 covering a sidewall and a bottom portion of the gate.

In some specific examples, the material of the first barrier layer 108 includes, but is not limited to, one or more of titanium, tantalum, tungsten, titanium nitride, tantalum nitride, tungsten nitride, silicon oxycarbide, silicon carbonitride or silicon oxycarbonitride. The material of the first barrier layer 108 needs to have good barrier and diffusion properties, good stability at high temperature, corrosion and oxidation resistance, good contact with the semiconductor and the metal, and high electrical conductivity but low ohmic contact resistance, so that it can ensure that the first barrier layer 108 may prevent the metal in the gate from diffusing into the gate dielectric layer 105 to avoid affecting the performance of the device.

In some specific examples, the material of the gate includes, but is not limited to, tungsten and titanium nitride.

In some embodiments, as shown in FIG. 3A to FIG. 3D, the semiconductor structure further includes an insulating cover layer 110 arranged in the trench and on the gate structure 107.

Here, the insulating cover layer 110 is configured to isolate the source 102 from the drain 103.

In some specific examples, the material of the insulating cover layer 110 includes, but is not limited to, silicon nitride.

In some embodiments, as shown in FIG. 3C and FIG. 3D, the gate structure 107 further includes a second barrier layer 111 arranged on a top portion of the gate.

In some specific examples, the material of the second barrier layer 111 includes, but is not limited to, one or more of titanium, tantalum, tungsten, titanium nitride, tantalum nitride, tungsten nitride, silicon oxycarbide, silicon carbonitride or silicon oxycarbonitride. The second barrier layer 111 may prevent the metal in the gate 109 from diffusing into the insulating cover layer 110 to avoid affecting the performance of the device.

The embodiments of the present disclosure provide a semiconductor structure, a method for manufacturing a semiconductor structure, and a memory. The semiconductor structure includes: a source 102 and a drain 103 which are arranged in the substrate 101; a gate dielectric layer 105 arranged in the substrate 101 and covering a sidewall and a bottom portion of a trench defined between the source 102 and the drain 103; a gate structure 107 arranged in the trench, a material of the gate structure 107 including metal or metal compound; and a gate adjustment layer 106 at least arranged between the gate dielectric layer 105 and the gate structure 107. A sidewall of the gate structure 107 is provided with a first control area covered with the gate adjustment layer 106, and a bottom surface of the gate structure 107 is provided with a second control area not covered with the gate adjustment layer 106. A material of the gate adjustment layer 106 includes polycrystalline silicon. In the embodiments of the present disclosure, the sidewall of the gate structure 107 is provided with the first control area covered with the gate adjustment layer 106, so that the problem of gate-induced drain leakage may be effectively improved. The bottom surface of the gate structure 107 is provided with the second control area not covered with the gate adjustment layer 106, which can improve the problem that the current is reduced due to too large resistance caused by the fact that the gate structure 107 is completely surrounded by the gate adjustment layer 106. The first control area and the second control area are both provided, so that the problem of gate-induced drain leakage may be improved, and the semiconductor structure has relatively small resistance, thereby effectively improving the performance of the semiconductor structure.

Based on the above-mentioned semiconductor structure, an embodiment of the present disclosure also provides a memory, which includes:
 the semiconductor structure as described in the above embodiments;
 a memory cell coupled with one of the source 102 and the drain 103; and
 a bit line coupled with the other one of the source 102 and the drain 103.

In some embodiments, the memory includes a DRAM, a ferroelectric memory, a phase change memory, a magnetic change memory, or a resistive memory.

In some embodiments, the memory includes a DRAM, and the memory cell includes a storage capacitor.

One end of the storage capacitor is connected to the source 102 of the semiconductor structure;
The bit line is connected to the drain 103 of the semiconductor structure.

In practical applications, the storage capacitor may have various structures. In some embodiments, the storage capacitor includes a cup-shaped cylinder-shaped or pillar-shaped capacitor.

Exemplarily, the storage capacitor may include a cup-shaped capacitor CUP, a cylinder-shaped capacitor CYL, and a pillar-shaped capacitor PIL. Herein, each of the cup-shaped capacitor CUP, the cylinder-shaped capacitor CYL, and the pillar-shaped capacitor PIL includes a bottom electrode, a top electrode, and a dielectric layer between the bottom electrode and the top electrode.

It should be noted that the bottom electrode is connected to the source 102 of the semiconductor structure, and the top electrode of the cup-shaped capacitor CUP is grounded, and the cup-shaped capacitor CUP is configured to store the written data.

It should be noted that in a case that the areas of the bottom electrodes in the cup-shaped capacitor CUP the cylinder-shaped capacitor CYL and the pillar-shaped PIL are equal to each other, the area of the top electrode of the cylinder-shaped capacitor CYL is the largest, and the area of the top electrode of each of the cylinder-shaped capacitor CYL and the pillar-shaped PIL is smaller. Based on this, in practical applications, the cylinder-shaped capacitor CYL may be used as the memory cell of the memory, which is beneficial to improve the integration of the memory.

In the embodiments of the present disclosure, some common memories are exemplarily listed, and the protection scope of the present disclosure is not limited thereto. Any memory including the semiconductor structure provided in the embodiments of the present disclosure falls within the protection scope of the present disclosure.

In practical applications, the memory further includes a resistor.

The resistor is connected between the bit line and the source 102 of the semiconductor structure, or the resistor is connected between the bit line and the drain 103 of the semiconductor structure. The resistor is configured to adjust the state of the data stored in the memory cell through the bit line voltage provided by the bit line.

Figure 4:
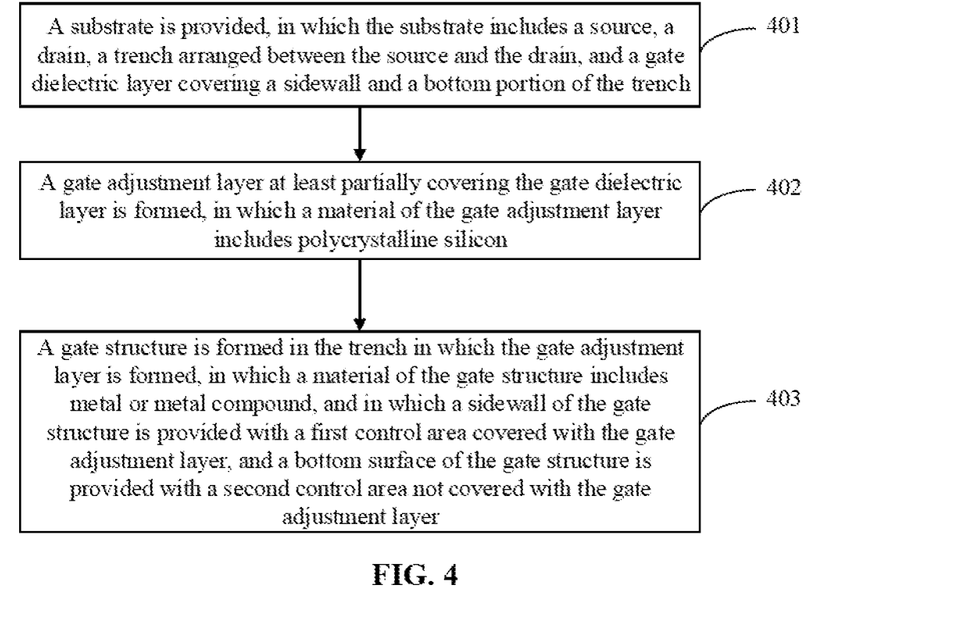
FIG. 4 is a flowchart of a method for manufacturing a semiconductor structure according to an embodiment of the present disclosure.

FIG. 4 is a flowchart of a method for manufacturing a semiconductor structure according to an embodiment of the present disclosure. As shown in FIG. 4, the method for manufacturing the semiconductor structure provided in the embodiment of the present disclosure includes the following operations.

In S401, a substrate is provided. The substrate includes a source, a drain, a trench arranged between the source and the drain, and a gate dielectric layer covering a sidewall and a bottom portion of the trench.

In S402, a gate adjustment layer at least partially covering the gate dielectric layer is formed. A material of the gate adjustment layer includes polycrystalline silicon.

In S403, a gate structure is formed in the trench in which the gate adjustment layer is formed. A material of the gate structure includes metal or metal compound.

A sidewall of the gate structure is provided with a first control area covered with the gate adjustment layer, and a bottom surface of the gate structure is provided with a second control area not covered with the gate adjustment layer.

In some embodiments, an area of the first control area accounts for 60%-100% of an area of the sidewall of the gate structure.

In some embodiments, a top edge of the first control area is not lower than a top edge of the sidewall of the gate structure.

In some embodiments, the gate structure is provided with a protrusion in the second control area.

In some embodiments, the operation that the gate adjustment layer is formed includes the following operations.

A first gate adjustment material layer at least partially covering the gate dielectric layer is formed.

The first gate adjustment material layer is doped with a doping type different from a doping type of each of the source and the drain, so as to form the gate adjustment layer.

In some embodiments, the operation that the gate adjustment layer at least partially covering the gate dielectric layer is formed includes the following operations.

A second gate adjustment material layer covering a sidewall and a bottom portion of the gate dielectric layer is formed.

The second gate adjustment material layer covering the bottom portion and a portion of the sidewall of the gate dielectric layer is removed to form the gate adjustment layer.

In some embodiments, the gate structure includes a gate and a first barrier layer. The operation that the gate structure is formed includes the following operations.

A first bather material layer is formed on a surface of the substrate and on the sidewall and the bottom portion of the trench in which the gate adjustment layer is formed.

A gate material layer is formed on the surface of the substrate and in the trench in which the first bather material layer is formed.

The gate material layer is planarized to expose the surface of the substrate.

A portion of the first barrier material layer in the trench and a portion of the gate material layer in the trench are removed to form the gate structure.

In some embodiments, the operation that the gate adjustment layer at least partially covering the gate dielectric layer is formed includes the following operations.

A third gate adjustment material layer covering a sidewall and a bottom portion of the gate dielectric layer is formed.

The gate structure is formed in the trench in which the third gate adjustment material layer is formed.

A fourth gate adjustment material layer is formed on the gate structure and in the trench in which the gate structure is formed.

The third gate adjustment material layer covering a portion of the bottom portion of the gate dielectric layer, and a portion of the fourth gate adjustment material layer are removed to form the gate adjustment layer.

In some embodiments, the gate structure includes a gate, a first barrier layer and a second bather layer. The operation that the gate structure is formed includes the following operations.

A first bather material layer is formed on a surface of the substrate and on the sidewall and the bottom portion of the trench in which the third gate adjustment material layer is formed.

A gate material layer is formed on the surface of the substrate and in the trench in which the first bather material layer is formed.

The gate material layer on the surface of the substrate and the first bather material layer on the surface of the substrate are removed by dry etching.

A portion of the first barrier material layer in the trench and a portion of the gate material layer in the trench are removed by wet etching.

The second bather layer is formed on a remaining portion of the first bather material layer in the trench and on a remaining portion of the gate material layer in the trench to form the gate structure.

In some embodiments, the method further includes the following operation.

An insulating cover layer is formed on the gate structure and in the trench in which the gate structure is formed.

FIG. 5A to FIG. 5I are schematic diagrams of processes of a method for manufacturing a semiconductor structure according to an embodiment of the present disclosure. It should be understood that the operations shown in FIG. 4 are not exclusive, and other operations may also be performed before, after or between any operations in the operations as shown. The sequence of the operations shown in FIG. 4 may be adjusted according to actual needs. The method for manufacturing the semiconductor structure provided by the embodiments of the present disclosure will be described in detail below with reference to FIG. 4 and FIG. 5A to FIG. 5I.

It should be noted that FIG. 5A to FIG. 5I are schematic diagrams of a complete realization process reflecting the method for manufacturing the semiconductor structure, and some unmarked parts in some figures may be shared with each other.

Figure 5A:
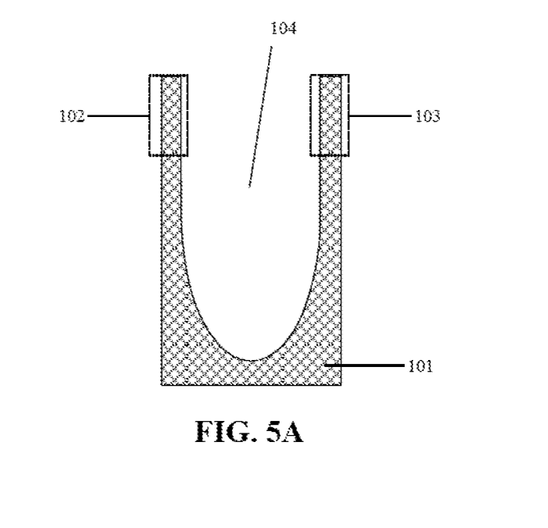

First, as shown in FIG. 5A, in S401, a substrate 101 is mainly provided.

The substrate 101 includes a source 102, a drain 103, and a trench 104 arranged between the source 102 and the drain 103.

In some specific examples, the substrate 101 may include an elemental semiconductor material substrate (for example, a silicon (Si) substrate, a germanium (Ge) substrate, etc.), a compound semiconductor material substrate (for example, a silicon germanium (Site) substrate, etc.), a SOI substrate, a GeOI substrate, etc. Preferably, the substrate is a silicon substrate.

In some specific examples, the substrate 101 may be formed through a Physical Vapor Deposition (PVD) process, a Chemical Vapor Deposition (CVD) process, an Atomic Layer Deposition (ALD) process, etc.

In some specific examples, the substrate 101 may be etched through a dry etching process, for example, a plasma etching process or a reactive ion etching process, so as to form the trench 104 in the substrate 101.

Figure 5B:
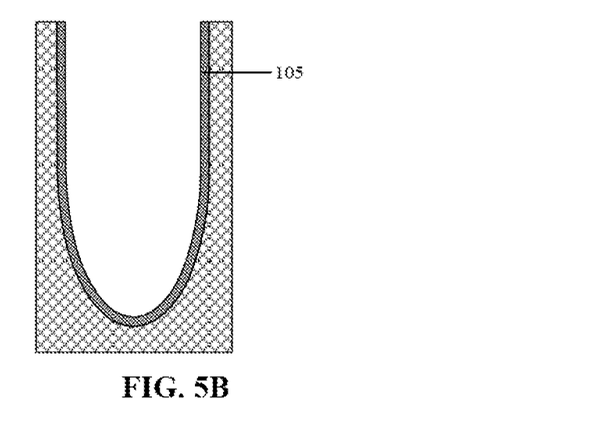

Next, as shown in FIG. 5B, a gate dielectric layer 105 is formed in the sidewall and the bottom portion of the trench 104. In some specific examples, the material of the gate dielectric layer 105 includes, but is not limited to, silicon oxide. The methods for forming the gate dielectric layer 105 includes, but are not limited to, a PVD process, s CVD process, an ALD process, etc.

In S402, the gate adjustment layer 106 is mainly formed.

Figure 5C:
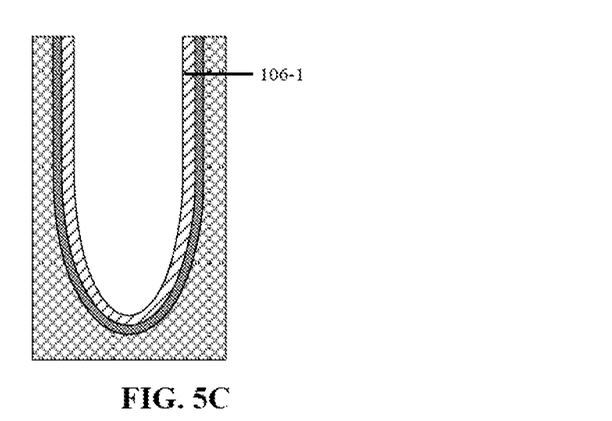

As shown in FIG. 5C, a gate adjustment material layer 106-1 covering the sidewall and the bottom portion of the gate dielectric layer 105 is formed in the trench 104 on which the gate dielectric layer 105 is formed.

In some specific examples, the material of the gate adjustment material layer 106-1 includes, but is not limited to, polycrystalline silicon. The methods for forming the gate adjustment material layer 106-1 include, but are not limited to, a Low Pressure Chemical Vapor Deposition (LPCVD) process, a CVD process, an ALD process, etc. After the gate adjustment material layer 106-1 is formed, the gate material layer 109-1 is doped. The doping methods include, but are not limited to, ion implantation and diffusion. Exemplarily, when the doping type of the gate adjustment layer 106 is P-type doping, the P-type impurity source may be boron (B), aluminum (Al), etc., and the P-type impurity source is not limited thereto. When the doping type of the gate adjustment layer 106 is N-type doping, the N-type impurity source may be phosphorus (P), arsenic (As), etc., and the N-type impurity source is not limited thereto.

Figure 5D:
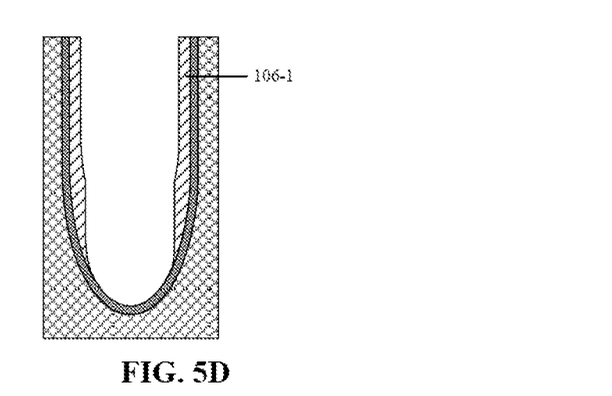

Next, as shown in FIG. 5D, the formed gate adjustment material layer 106-1 is partially removed. In some specific examples, the gate adjustment material layer 106-1 covering the bottom portion and a portion of the sidewall of the gate dielectric layer 105 may be removed. In other specific examples, the gate adjustment material layer 106-1 covering the bottom portion of the gate dielectric layer 105 may be removed, and the gate adjustment material layer 106-1 covering the sidewall of the gate dielectric layer 105 is not removed. FIG. 5D shows the case that the gate adjustment material layer 106-1 covering the bottom portion of the gate dielectric layer 105 is removed, and the gate adjustment material layer 106-1 covering the sidewall of the gate dielectric layer 105 is not removed.

The method for removing a portion of the gate adjustment layer 106 in some specific examples includes, but is not limited to, a dry plasma etching process.

In some specific examples, the amount of the gate adjustment material layer 106-1 may be selectively removed by adjusting the process parameters in the plasma dry etching process.

In some specific examples, after a portion of the gate adjustment material layer 106-1 is removed through the plasma dry etching process, it may be further cleaned with diluted hydrofluoric acid.

In S403, the gate structure 107 is mainly formed.

Figure 5E:
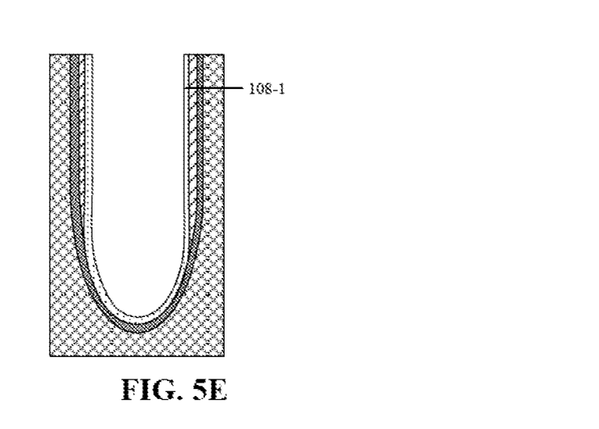

As shown in FIG. 5E, a first barrier material layer 108-1 is formed in the trench 104 on which the gate adjustment layer 106 is formed. Specifically, the first bather material layer 108-1 may be formed on the surface of the substrate 101 and on the sidewall and the bottom portion of the trench 104 on which the gate adjustment layer 106 is formed.

Here, the material of the first barrier material layer 108-1 includes, but is not limited to, titanium nitride. The method for forming the first barrier material layer 108-1 includes, but is not limited to, an ALD process.

Figure 5F:
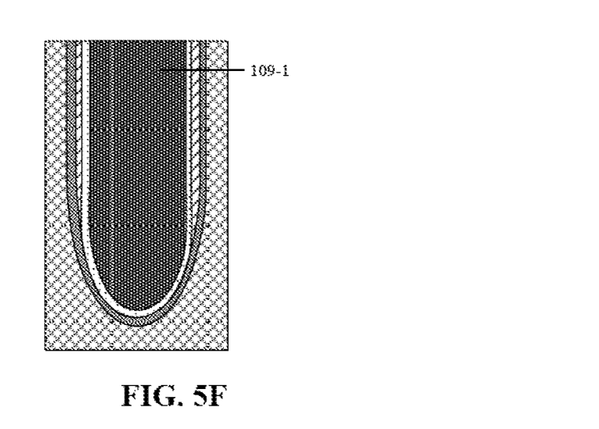

Next, as shown in FIG. 5F, a gate material layer 109-1 is formed on the surface of the substrate 101 and in the trench 104 on which the fast barrier material layer 108-1 is formed.

Here, the material of the gate material layer 109-1 includes, but is not limited to, tungsten and titanium nitride. The method for forming the gate material layer 109-1 includes, but is not limited to, a CVD process.

In some specific examples, after the gate material layer 109-1 and the first barrier material layer 108-1 are formed, the gate material layer 109-1 and the first barrier material layer 108-1 are planarized to expose the surface of the substrate 101. In some specific examples, the method for planarizing the gate material layer 109-1 and the first barrier material layer 108-1 includes, but is not limited to, a Chemical Mechanical Polishing (CMP) process.

Figure 5G:
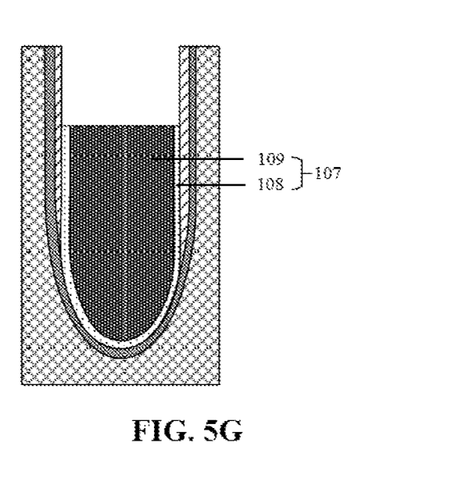

Next, as shown in FIG. 5G, a portion of the first barrier material layer 108-1 in the trench 104 and a portion of the gate material layer 109-1 in the french 104 are removed to form the first barrier layer 108 and the gate 109, and the first barrier layer 108 and the gate 109 form the gate structure 107 together.

In some specific examples, the method for removing a portion of the gate material layer 109-1 and a portion of the first barrier material layer 108-1 includes, but is not limited to, a dry plasma etching process. After a portion of the first barrier material layer 108-1 in the trench 104 and a portion of the gate material layer 109-1 in the trench 104 are removed, it may be cleaned with sulfuric acid or diluted hydrofluoric acid.

Figure 5H:
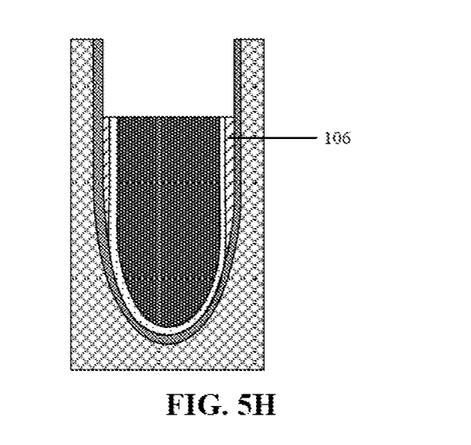

Next, as shown in FIG. 511, a portion of the gate adjustment material layer 106-1 in the trench 104 is removed, so that the top surface of the gate adjustment material layer 106-1 is flush with the top surface of the first barrier layer 108 and the top surface of the gate 109, thereby forming the gate adjustment layer 106.

In some specific examples, the method for removing a portion of the gate adjustment material layer 106-1 includes, but is not limited to, a wet etching process.

Figure 5I:
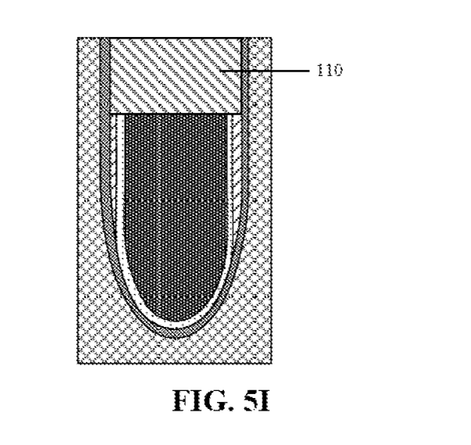

Next, as shown in FIG. 5I, an insulating cover layer 110 is formed on the gate structure 107 and in the trench 104 on which the gate structure 107 is formed. In some specific examples, the material of the insulating cover layer 110 includes, but is not limited to, silicon nitride. The methods for forming the insulating cover layer 110 include, but are not limited to, a LPCVD process and a CND process.

FIG. 6A to FIG. 6L are schematic diagrams of processes of a method for manufacturing another semiconductor structure according to an embodiment of the present disclosure. The method for manufacturing the semiconductor structure provided by the embodiment of the present disclosure will be further described below with reference to FIG. 6A to FIG. 6L.

It should be noted that FIG. 6A to FIG. 6L are the schematic diagrams of a complete realization process reflecting the method for manufacturing the semiconductor structure, and some unmarked parts in some figures may be shared with each other.

Figure 6A:
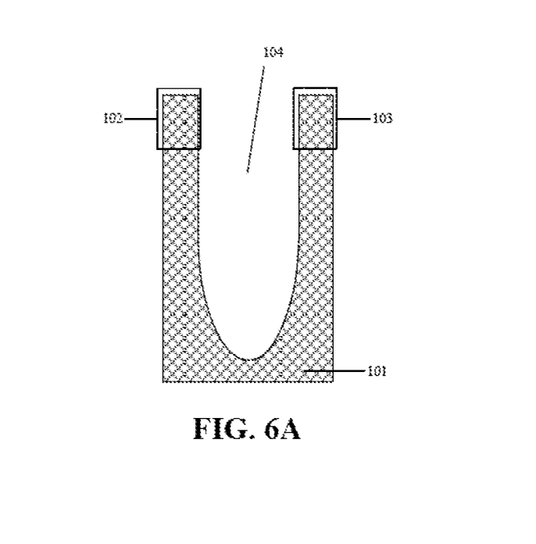
Figure 6B:
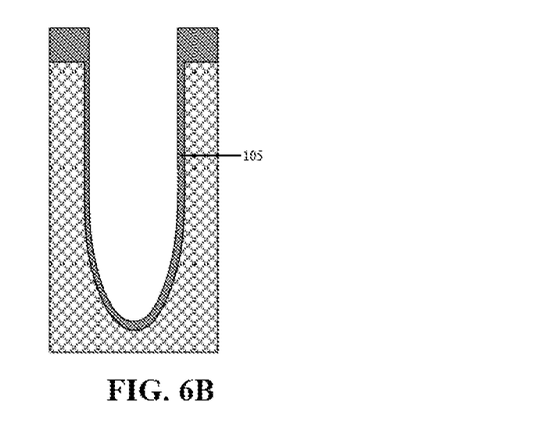

FIG. 6A shows that the substrate 101 is provided, and FIG. 6B shows that the gate dielectric layer 105 is formed. The formation of this part is similar to the method in the previous embodiment, which is not repeated herein.

Figure 6C:
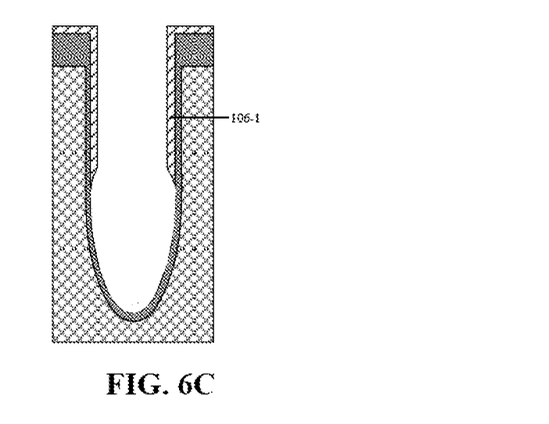

FIG. 6C shows that the gate adjustment material layer 106-1 is formed. Specifically, the gate adjustment material layer 106-1 covering the sidewall and the bottom portion of the gate dielectric layer 105 is formed. After the gate adjustment material layer 106-1 covering the sidewall and the bottom portion of the gate dielectric layer 105 is formed, the gate adjustment material layer 106-1 at the bottom portion of the gate dielectric layer 105 and a portion of the gate adjustment material layer 106-1 on the sidewall of the gate dielectric layer 105 are removed.

Here, a portion of the gate adjustment material layer 106-1 may be removed through a dry plasma etching process. The purpose of adjusting the amount of the gate adjustment material layer 106-1 may be achieved by adjusting the process parameters of the dry plasma etching process.

Figure 6D:
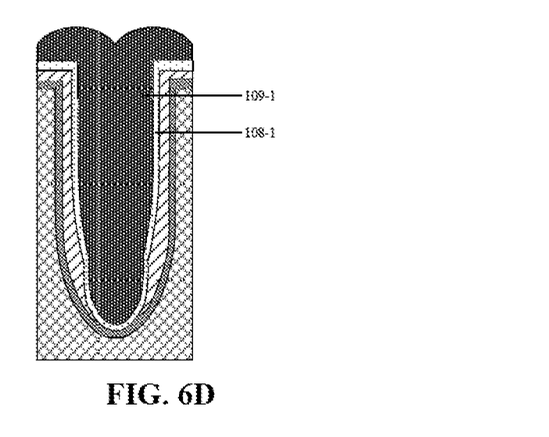

As shown in FIG. 6D, after the gate adjustment material layer 106-1 is formed, the first bather material layer 108-1 and the gate material layer 109-1 are formed on the sidewall and the bottom surface of the trench 104 on which the gate adjustment material layer 106-1 is formed. The gate dielectric layer 105, the gate adjustment material layer 106-1, the first bather material layer 108-1 and the gate material layer 109-1 are formed in the trench 104, at the same time, the gate dielectric layer 105, the gate adjustment material layer 106-1, the first bather material layer 108-1, and the gate material layer 109-1 are also sequentially formed on the surface of the substrate 101.

Here, the gate material layer 109-1 contains, but is not limited to, tungsten and titanium nitride.

Figure 6E:
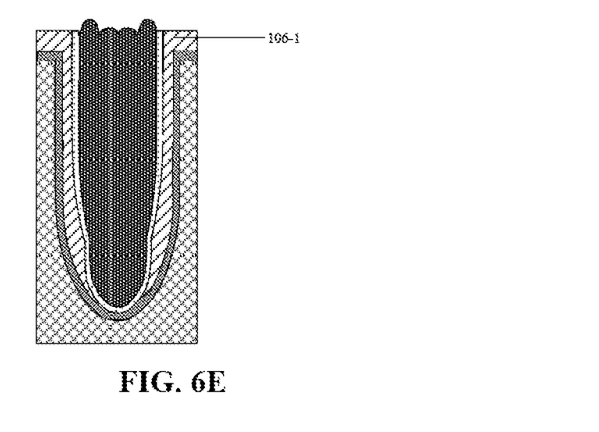

As shown in FIG. 6E, the first barrier material layer 108-1 and the gate material layer 109-1 on the surface of the substrate 101 may be removed by dry plasma etching, so as to expose the gate adjustment material layer 106-1 on the surface of the substrate 101.

Figure 6F:
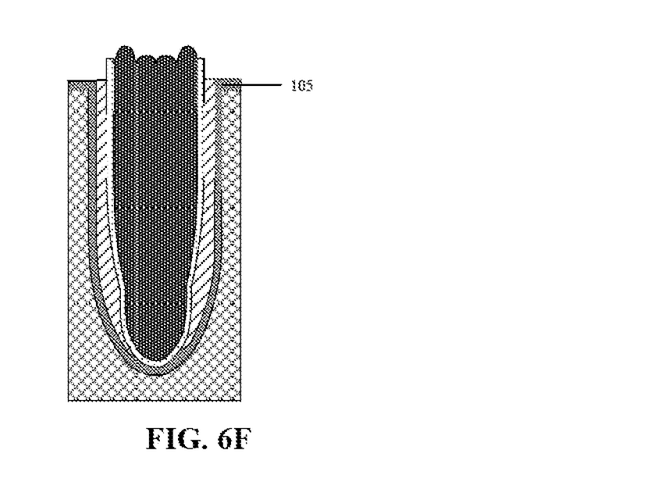

Next, as shown in FIG. 6F, the gate adjustment material layer 106-1 on the surface of the substrate 101 is removed through the dry plasma etching process, so as to expose the gate dielectric layer 105 on the surface of the substrate 101.

Figure 6G:
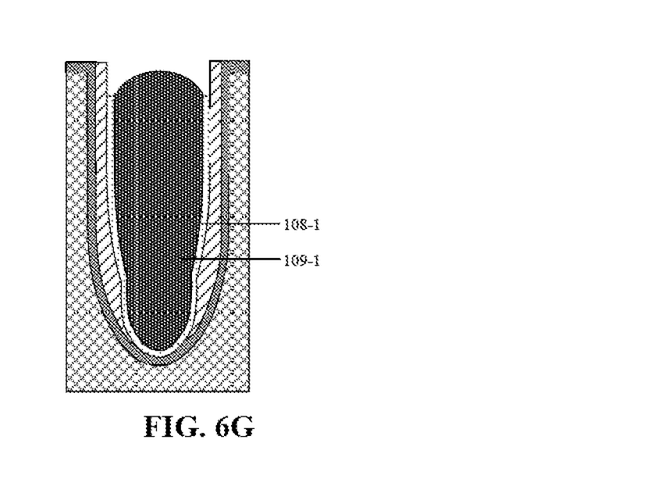

Next, as shown in FIG. 6G, a portion of the first barrier material layer 108-1 and a portion of the gate material layer 109-1 in the trench 104 are removed through the wet etching process, so that the top surface of a remaining portion of the first barrier material layer 108-1 and the top surface of a remaining portion of the gate material layer 109-1 are curved surfaces.

Figure 6H:
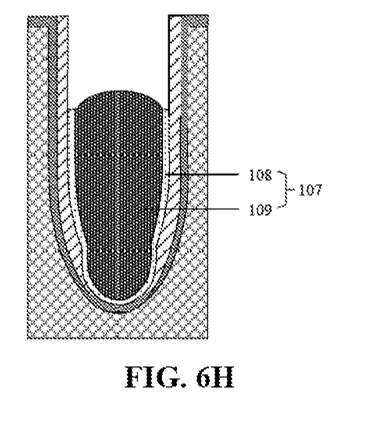

Next, as shown in FIG. 6H, the remaining portion of the first barrier material layer 108-1 and the remaining portion of the gate material layer 109-1 are further removed through the dry plasma etching process to form the first barrier layer 108 and the gate 109. The top surfaces of the first barrier layer 108 and the gate 109 are curved surfaces.

Figure 6I:
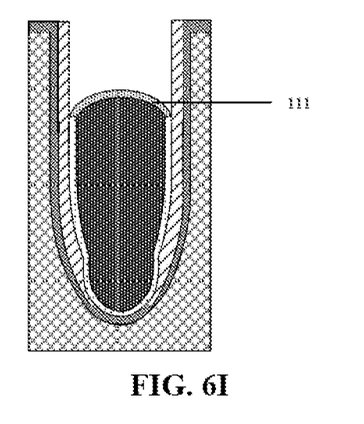

Next, as shown in FIG. 6I, a second barrier layer 111 is formed on the first bather layer 108 and the gate 109 in the trench 104, so that the second bather layer 111, the first barrier layer 108, and the gate 109 form the gate structure 107 together.

Figure 6J:
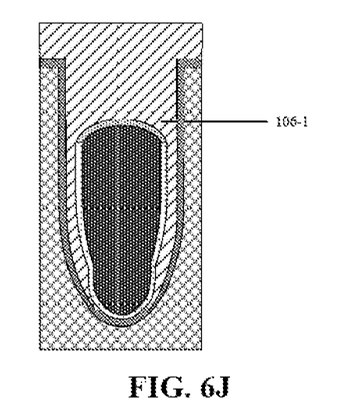

Next, as shown in FIG. 6J, the gate adjustment material layer 106-1 is formed again on the gate structure 107 and in the trench 104 on which the gate structure 107 is formed.

Figure 6K:
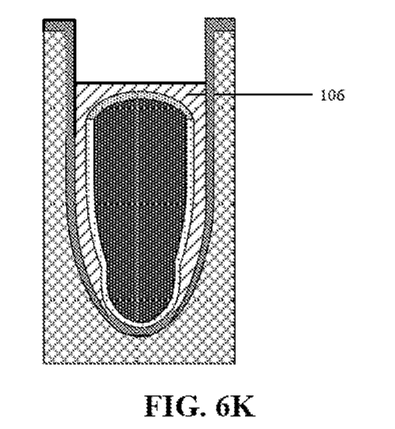

Next, as shown in FIG. 6K, a portion of the gate adjustment material layer 106-1 covering the top portion of the gate structure 107 is removed, so that the gate adjustment material layer 106-1 covering the sidewall and the bottom surface of the gate dielectric layer 105, and a remaining portion of the gate adjustment material layer 106-1 covering the top portion of the gate structure 107 form the gate adjustment layer 106 together.

Figure 6L:
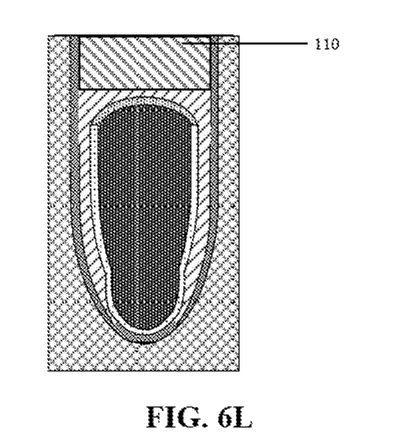

Next, as shown in FIG. 6L, the insulating cover layer 110 is formed on the gate structure 107 and in the trench 104 on which the gate structure 107 is formed.

It should be noted that the schematic diagrams of the semiconductor structures provided in the embodiments of the present disclosure are only exemplary demonstrations, and may be combined with each other without conflict. The flowcharts of the methods for manufacturing the semiconductor structures provided in the embodiments of the present disclosure are only exemplary demonstrations, and may also be combined with each other without conflict.

In addition, an embodiment of the present disclosure also provides a method for manufacturing a memory.

First, a semiconductor structure is formed, and the method for forming the semiconductor structure has been described above, which is not repeated.

The operation that multiple memory cells are formed may include the following operations. A memory cell contact hole is formed on a source. The memory cell contact hole is filled with a metal material to form a memory cell contact. A memory cell hole is formed on the memory cell contact. A memory cell is formed in the memory cell hole, for example, a storage capacitor is formed. In another embodiment, the formed memory cell is a magnetic tunnel junction.

The bit line is formed by forming a metal line at a predetermined bit line position. The metal line includes, but is not limited to, tungsten (W), cobalt (Co), copper (Cu), aluminum (Al), polycrystalline silicon, doped silicon, suicide, or any combination thereof.

In the several embodiments provided in the present disclosure, it should be understood that the disclosed device and method may be implemented in non-targeted manners. The described device embodiments are merely exemplary. For example, the unit division is merely logical function division and may be other division in an actual implementation. For example, a plurality of units or components may be combined or integrated into another system, or some features may be ignored or not preformed. In addition, the displayed or discussed components may be coupled or direct coupled to each other.

The features disclosed in several method or device embodiments provided in the present disclosure may be arbitrarily combined without conflicts, so as to obtain new method embodiments or device embodiments.

The above are only specific implementations of the present disclosure, but the protection scope of the present disclosure is not limited thereto. Any skilled in the art, within the technical scope disclosed by the present disclosure, may easily think of variations or replacements, which should be covered within the protection scope of the present disclosure. Therefore, the protection scope of the present disclosure should be subjected to the protection scope of the claims.

The invention claimed is:

1. A semiconductor structure, comprising:
a source and a drain which are arranged in a substrate;
a gate dielectric layer arranged in the substrate and covering a sidewall and a bottom portion of a trench defined between the source and the drain;
a gate structure arranged in the trench, wherein a material of the gate structure comprises metal or metal compound; and
a gate adjustment layer at least arranged between the gate dielectric layer and the gate structure,
wherein a sidewall of the gate structure is provided with a first control area covered with the gate adjustment layer, and a bottom surface of the gate structure is provided with a second control area not covered with the gate adjustment layer, and a material of the gate adjustment layer comprises polycrystalline silicon, the gate adjustment layer covers a top surface of the gate structure, a contact interface between the gate adjustment layer and the top surface of the gate structure is a curved surface.

2. The semiconductor structure according to claim 1, wherein an area of the first control area accounts for 60%-100% of an area of the sidewall of the gate structure.

3. The semiconductor structure according to claim 1, wherein a top edge of the first control area is higher than or is flush with a top edge of the sidewall of the gate structure.

4. The semiconductor structure according to claim 1, wherein the gate structure is provided with a protrusion in the second control area.

5. The semiconductor structure according to claim 1, wherein the gate adjustment layer is doped with impurities, and a doping type of the gate adjustment layer is different from a doping type of each of the source and the drain.

6. The semiconductor structure according to claim 5, wherein a doping concentration of the impurities doped in the gate adjustment layer ranges from 1019 ions/cm3 to 1020 ions/cm3.

7. The semiconductor structure according to claim 1, wherein the gate adjustment layer at least covers a portion of the sidewall of the gate structure and does not cover the bottom surface of the gate structure.

8. The semiconductor structure according to claim 1, wherein the material of the gate structure comprises at least one of tungsten or titanium nitride.

9. The semiconductor structure according to claim 1, wherein the gate structure comprises a gate, and a first barrier layer covering a sidewall and a bottom portion of the gate, and wherein the gate structure further comprises a second barrier layer arranged on a top portion of the gate.

10. The semiconductor structure according to claim 1, further comprising an insulating cover layer arranged in the trench and on the gate structure.

11. A memory, comprising:
a semiconductor structure;
a memory cell coupled with one of the source and the drain; and
a bit line coupled with the other one of the source and the drain,
wherein the semiconductor structure comprises:
a source and a drain which are arranged in a substrate;

a gate dielectric layer arranged in the substrate and covering a sidewall and a bottom portion of a trench defined between the source and the drain;

a gate structure arranged in the trench, wherein a material of the gate structure comprises metal or metal compound; and a gate adjustment layer at least arranged between the gate dielectric layer and the gate structure, wherein a sidewall of the gate structure is provided with a first control area covered with the gate adjustment layer, and a bottom surface of the gate structure is provided with a second control area not covered with the gate adjustment layer, and a material of the gate adjustment layer comprises polycrystalline silicon, the gate adjustment layer covers a top surface of the gate structure, a contact interface between the gate adjustment layer and the top surface of the gate structure is a curved surface.

12. A method for manufacturing a semiconductor structure, comprising:

providing a substrate, wherein the substrate comprises a source, a drain, a trench arranged between the source and the drain, and a gate dielectric layer covering a sidewall and a bottom portion of the trench;

forming a gate adjustment layer at least partially covering the gate dielectric layer, wherein a material of the gate adjustment layer comprises polycrystalline silicon; and forming a gate structure in the trench in which the gate adjustment layer is formed, wherein a material of the gate structure comprises metal or metal compound, wherein a sidewall of the gate structure is provided with a first control area covered with the gate adjustment layer, and a bottom surface of the gate structure is provided with a second control area not covered with the gate adjustment layer, the gate adjustment layer covers a top surface of the gate structure, a contact interface between the gate adjustment layer and the top surface of the gate structure is a curved surface.

13. The method according to claim 12, wherein an area of the first control area accounts for 60%-100% of an area of the sidewall of the gate structure.

14. The method according to claim 12, wherein a top edge of the first control area is higher than or is flush with a top edge of the sidewall of the gate structure.

15. The method according to claim 12, wherein the gate structure is provided with a protrusion in the second control area.

16. The method according to claim 12, wherein forming the gate adjustment layer comprises:

forming a first gate adjustment material layer at least partially covering the gate dielectric layer; and doping the first gate adjustment material layer with a doping type different from a doping type of each of the source and the drain to form the gate adjustment layer.

17. The method according to claim 12, wherein forming the gate adjustment layer at least partially covering the gate dielectric layer comprises:

forming a second gate adjustment material layer covering a sidewall and a bottom portion of the gate dielectric layer; and removing the second gate adjustment material layer covering the bottom portion and a portion of the sidewall of the gate dielectric layer to form the gate adjustment layer, wherein the gate structure comprises a gate and a first barrier layer, and wherein forming the gate structure comprises:

forming a first barrier material layer on a surface of the substrate and on the sidewall and the bottom portion of the trench in which the gate adjustment layer is formed;

forming a gate material layer on the surface of the substrate and in the trench in which the first barrier material layer is formed;

planarizing the gate material layer to expose the surface of the substrate; and removing a portion of the first barrier material layer in the trench and a portion of the gate material layer in the trench to form the gate structure, wherein the method further comprises forming an insulating cover layer on the gate structure and in the trench in which the gate structure is formed.

18. The method according to claim 12, wherein forming the gate adjustment layer at least partially covering the gate dielectric layer comprises:

forming a third gate adjustment material layer covering a sidewall and a bottom portion of the gate dielectric layer;

forming the gate structure in the trench in which the third gate adjustment material layer is formed;

forming a fourth gate adjustment material layer on the gate structure and in the trench in which the gate structure is formed; and removing the third gate adjustment material layer covering a portion of the bottom portion of the gate dielectric layer, and removing a portion of the fourth gate adjustment material layer to form the gate adjustment layer, wherein the gate structure comprises a gate, a first barrier layer and a second barrier layer, and wherein forming the gate structure comprises:

forming a first barrier material layer on a surface of the substrate and on the sidewall and the bottom portion of the trench in which the third gate adjustment material layer is formed;

forming a gate material layer on the surface of the substrate and in the trench in which the first barrier material layer is formed;

removing the gate material layer on the surface of the substrate and the first barrier material layer on the surface of the substrate by dry etching;

removing a portion of the first barrier material layer in the trench and a portion of the gate material layer in the trench by wet etching; and forming the second barrier layer on a remaining portion of the first barrier material layer in the trench and on a remaining portion of the gate material layer in the trench to form the gate structure.

* * * * *